(12) United States Patent
Nadershahi

(10) Patent No.: US 11,177,793 B2
(45) Date of Patent: Nov. 16, 2021

(54) CLOCK SYNTHESIS CIRCUITRY AND ASSOCIATED TECHNIQUES FOR GENERATING CLOCK SIGNALS REFRESHING DISPLAY SCREEN CONTENT

(71) Applicant: PLANAR SYSTEMS, INC., Beaverton, OR (US)

(72) Inventor: Shahnad Nadershahi, Beaverton, OR (US)

(73) Assignee: PLANAR SYSTEMS, INC., Beaverton, OR (US)

( * ) Notice: Subject to any disclaimer, the term of this patent is extended or adjusted under 35 U.S.C. 154(b) by 9 days.

(21) Appl. No.: 16/637,268

(22) PCT Filed: Aug. 9, 2018

(86) PCT No.: PCT/US2018/046111
§ 371 (c)(1),
(2) Date: Feb. 6, 2020

(87) PCT Pub. No.: WO2019/032899
PCT Pub. Date: Feb. 14, 2019

(65) Prior Publication Data
US 2020/0249713 A1    Aug. 6, 2020

Related U.S. Application Data

(60) Provisional application No. 62/543,321, filed on Aug. 9, 2017.

(51) Int. Cl.
*H03K 3/017*     (2006.01)
*G06F 1/04*      (2006.01)
(Continued)

(52) U.S. Cl.
CPC ............... *H03K 3/017* (2013.01); *G06F 1/04* (2013.01); *H03K 3/027* (2013.01); *H03K 3/84* (2013.01); *H05B 45/325* (2020.01)

(58) Field of Classification Search
CPC .......... H03K 3/017; H03K 3/027; H03K 3/84; G06F 1/04; H05B 45/325
(Continued)

(56) References Cited

U.S. PATENT DOCUMENTS 4,648,103 A * 3/1987 Welty .................... H03K 3/037
                                                    327/218
4,896,337 A     1/1990 Bushy, Jr.
(Continued)

FOREIGN PATENT DOCUMENTS

WO        2013076470 A2    5/2013

OTHER PUBLICATIONS

International Search Report and Written Opinion for International Application No. PCT/US2018/046111, dated Oct. 10, 2018, 10 pages.

*Primary Examiner* — Tomi Skibinski
(74) *Attorney, Agent, or Firm* — Stoel Rives LLP

(57) ABSTRACT

A clock synthesis circuit and method provides for precision controlling and programming a selected number of clock pulses (or simply "clocks") fitted within time periods between two consecutive pulses of a so-called system heartbeat (SHB) timing signal. The disclosed embodiments have applicability in light emitting diode (LED) display driver integrated circuits (ICs) and, more generally, digital circuits including computer processors, microcontrollers, logic devices such as field-programmable gate arrays (FP-GA), and other logic circuitry.

17 Claims, 8 Drawing Sheets

(51) Int. Cl.
*H03K 3/027* (2006.01)
*H03K 3/84* (2006.01)
*H05B 45/325* (2020.01)

(58) Field of Classification Search
USPC .......................................................... 713/500
See application file for complete search history.

(56) References Cited

U.S. PATENT DOCUMENTS

| | | | |
|---|---|---|---|
| 5,596,617 A | 1/1997 | Wolf et al. | |
| 6,650,162 B2 | 11/2003 | Dubey | |
| 6,707,332 B1 * | 3/2004 | Lee | G06F 1/08 |
| | | | 327/296 |
| 2005/0190127 A1 * | 9/2005 | Tomohara | G09G 3/3216 |
| | | | 345/76 |
| 2005/0238169 A1 * | 10/2005 | Quan | H04N 5/08 |
| | | | 380/206 |
| 2006/0077290 A1 * | 4/2006 | Chung | H04N 7/01 |
| | | | 348/441 |
| 2008/0298455 A1 * | 12/2008 | Greenblat | H03K 3/0315 |
| | | | 375/238 |
| 2009/0051397 A1 * | 2/2009 | Jung | H03K 5/1515 |
| | | | 327/173 |
| 2016/0043769 A1 * | 2/2016 | Wong | H03L 7/0995 |
| | | | 375/145 |

* cited by examiner

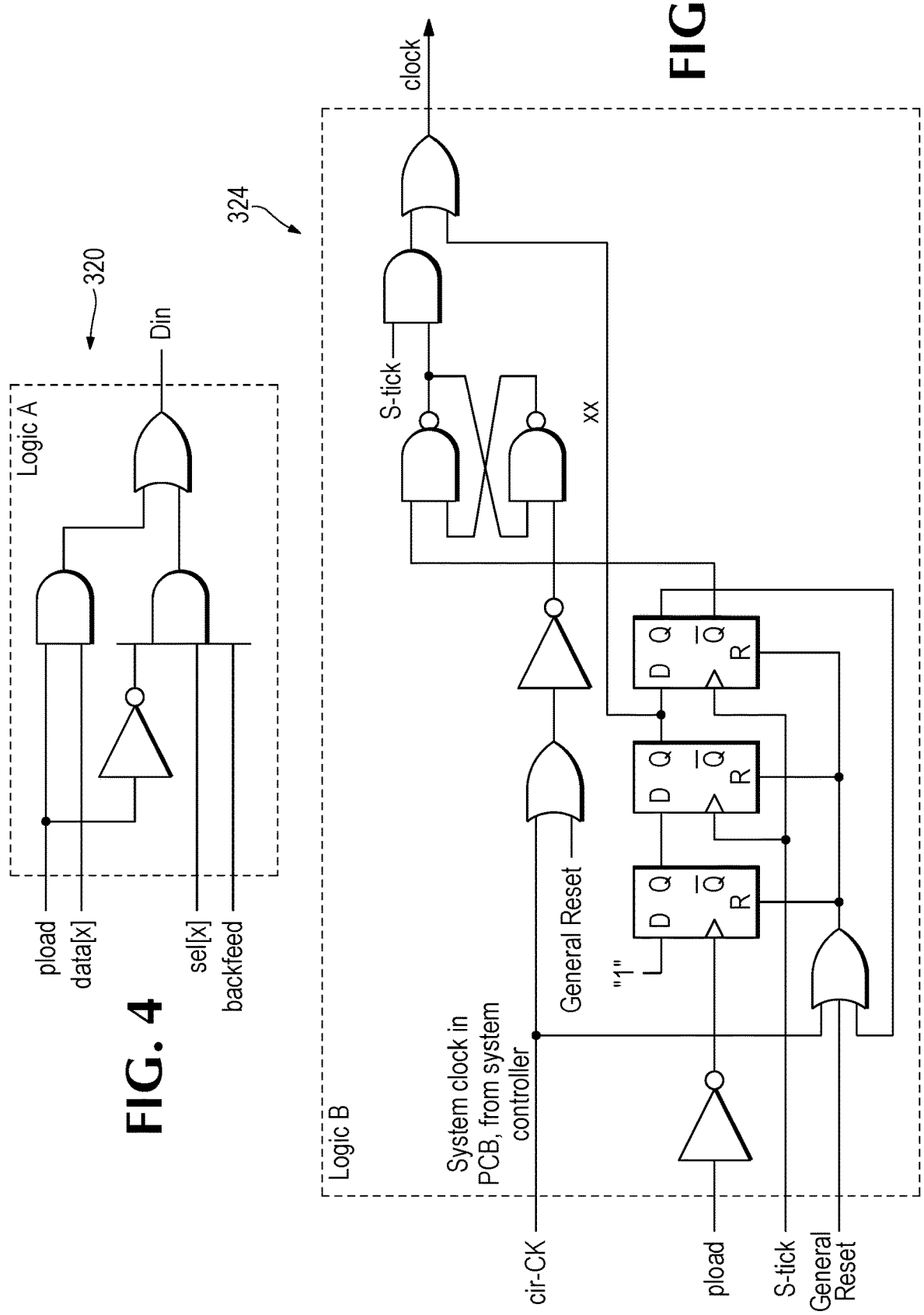

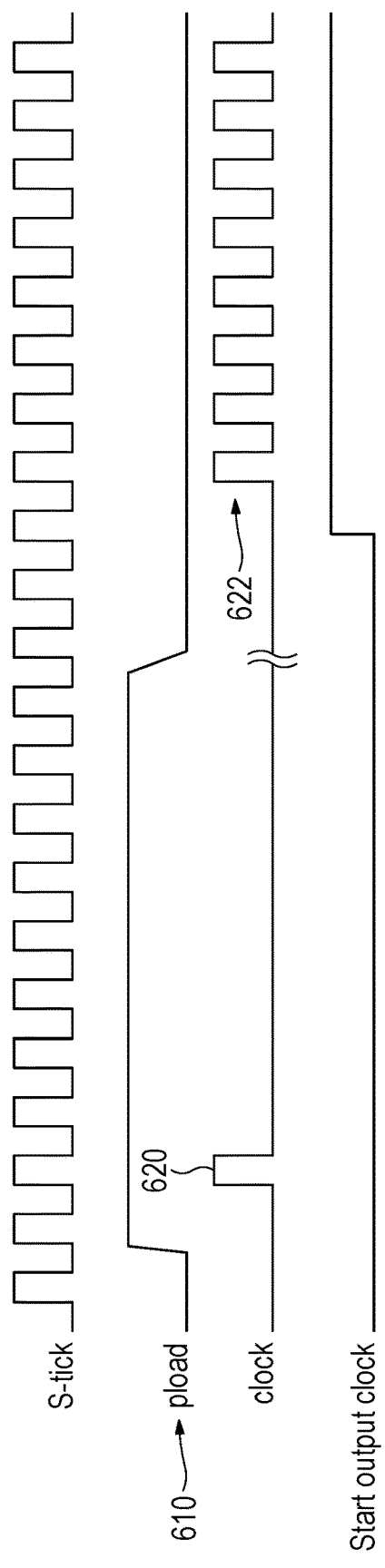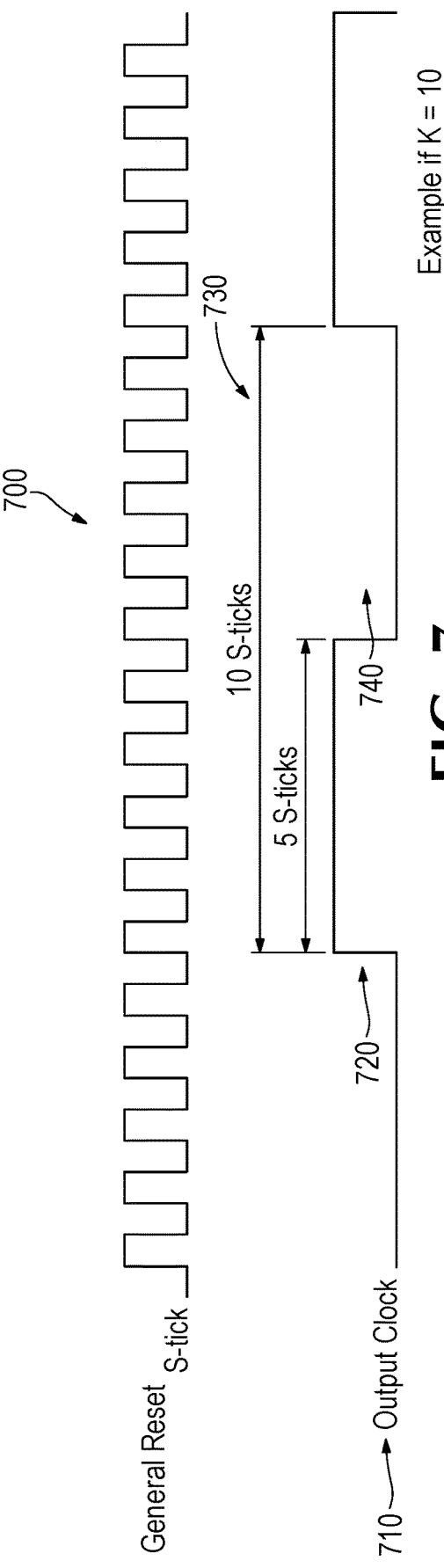

CLOCK SYNTHESIS CIRCUITRY AND ASSOCIATED TECHNIQUES FOR GENERATING CLOCK SIGNALS REFRESHING DISPLAY SCREEN CONTENT

RELATED APPLICATION

This application is a National Stage of International Application No. PCT/US2018/046111, filed Aug. 9, 2018, which claims priority benefit of U.S. Provisional Patent Application No. 62/543,321, filed Aug. 9, 2017, which are hereby incorporated by reference in their entireties.

TECHNICAL FIELD

This disclosure relates generally to driver circuits used for light emitting diodes (LEDs), and more particularly, to generating timing signals delivered to a driver circuit used for refreshing screen content by driving an array of LEDs present in digital signage displays and similar display applications including light sources for general illumination, signs and signals, display panels, televisions, and other applications. Irrespective of the particular application, LED driver circuits typically supply power to the LEDs, and this disclosure in turn relates to clock circuitry that controls the delivery and refreshing of visual content presented on a display screen.

BACKGROUND INFORMATION

The operation of a phase-locked loop (PLL) is based around the idea of comparing the phase of two signals. Information about the error in phase (or the phase difference) between the two signals is then used to control the frequency of a loop. Thus, a PLL is basically of form of servo loop. And conceptually, the operation of the PLL is relatively simple, but the mathematical analysis and many elements of its operation can become complicated. Although a PLL performs its actions on an input frequency signal, all the basic criteria for loop stability and other parameters are the same.

A basic PLL includes a phase comparator/detector, a loop filter, and a voltage controlled oscillator (VCO).

As the name implies, a phase comparator/detector circuit block within the PLL compares the phase of two signals and generates a voltage according to the phase difference between the two signals. A reference signal and a signal from the VCO are connected into the phase detector. The output from the phase detector is passed through the loop filter and then applied to the VCO.

The loop filter is used to filter the output from the phase comparator in the PLL. It is used to remove any components of the signals of which the phase is being compared from the VCO line. It also governs many of the characteristics of the loop and its stability. The error signal from the phase detector passes through a low pass filter which governs many of the properties of the loop and removes any high frequency elements on the signal.

Once through the loop filter, the error signal is applied to the control terminal of the VCO as its tuning voltage. Upon sensing any change in this voltage, the VCO tries to reduce the phase difference and hence the frequency between the two signals. The VCO is the circuit block that generates the output clock frequency signal. Its frequency can be controlled and swung over the operational frequency band for the loop. The VCO, within the PLL, produces a signal which enters the phase detector. Here, the phase of the signals from the VCO and the incoming reference signal are compared and a resulting difference or error voltage is produced. This corresponds to the phase difference between the two signals.

Initially the loop will be out of lock, and the error voltage will pull the frequency of the VCO towards that of the reference, until it cannot reduce the error any further and the loop is locked. When the PLL is in lock, a steady state error voltage is produced. By using an amplifier between the phase detector and the VCO, the actual error between the signals can be reduced to very small levels. A voltage signal, however, must always be present at the control terminal of the VCO as this is what puts onto the correct frequency. The fact that a steady error voltage is present means that the phase difference between the reference signal and the VCO is not changing. When the phase between these two signals is not changing, that means that the two signals are on exactly the same frequency.

SUMMARY OF THE DISCLOSURE

This disclosure describes effective PLL alternatives that are based the present inventor's leveraging his advancements in LED driver technology and his understanding of cost pressures compelling efficient use of silicon real estate. Accordingly, this disclosure describes a clock synthesis circuit for precision controlling and programming a fixed number of clocks fitted within time periods between two consecutive pulses of a so-called system heartbeat (SHB) timing signal.

According to some embodiments, a novel clock synthesis circuit and methods includes a ring oscillator having selectable output frequencies; a counter that divides down the ring oscillator output signal's frequency to desired clock marker frequencies; a counter that counts the number of high frequency clocks reference clock pulses (S-tick) as selected from the ring oscillator; and a method, algorithm, procedure, or the like (e.g., implemented in logic operations of digital electronics devices) for using such counts and associated data to generate a value of a number representing the ratio of the desired clock edges within the time period between the SHB pulses and the counter value.

Additionally, the following techniques are described as well: clock shaping, including duty cycle control, for deriving the synthesized output clock; ways to calibrate the said synthesized clock with the SHB pulse in the long run, meaning that the shape of the output clock that is created forms the duty cycle of the clocks from that moment on; spread spectrum and electromagnetic interference (EMI) abatement measures; and the capability to reacquire the clock frequency in desired fixed periods.

In some embodiments, clock synthesis circuitry for producing a number of output clock pulses within a period between system heartbeat (SHB) pulses, includes: a ring oscillator to generate a first reference clock signal having a first tick frequency; divide-by-M circuitry that, in response to application of the first reference clock signal, generates a second reference clock signal having a second tick frequency that is the first tick frequency divided by a value M; counter circuitry to count a number of pulses of the second reference clock signal that occur within the period between SHB pulses and thereby provide a corresponding counter value; a data interface to receive clock shaping data that is generated based the corresponding counter value and the number of output clock pulses such that the clock shaping data represents a number of pulses of the first reference clock signal per a cycle of the output clock pulses; and clock shaping circuitry to generate the output clock pulses based on the clock shaping data and the first reference clock signal.

In some embodiments the ring oscillator includes multiple groups of delay elements and the clock synthesis circuitry further comprises a multiplexer to select from a group of the multiple groups of delay elements a ring oscillator signal to serve as the first reference clock signal.

In other embodiments the clock shaping circuitry comprises a spread spectrum controller to vary a pulse width of one or more pulses of the output clock pulses.

In further embodiments, the clock synthesis circuitry further comprises an edge-alignment calibration controller communicatively coupled to the clock shaping circuitry and configured to temporally align a pulse of the output clock pulses with a pulse of the SHB pulses.

In yet some other embodiments the SHB pulses are vertical frame update pulses of display driver circuitry.

In still further embodiments, the output clock pulses are grayscale clock (GCLK) pulses of display driver circuitry.

In another embodiment, the clock synthesis circuitry further comprises a shift register of the clock shaping circuitry, the shift register having a feedback path length equal to the number of pulses of the first reference clock signal per a cycle of the output clock pulses.

In some embodiments a first portion of the bits have a first logic level and a second portion of the bits have a second logic level that is different from the first logic level, the first and second portions establishing, respectively, first and second states of pulses of the output clock pulses.

In other embodiments, the divide-by-M circuitry includes a chain of D flip-flop logic elements.

In further embodiments, the data interface is communicatively coupled to a system controller that, in response to receiving the corresponding counter value, determines, based the corresponding counter value and the number of output clock pulses, a ratio K representing the number of pulses of the first reference clock signal per the cycle of the output clock pulses, and provides the clock shaping data representing the ratio K.

In yet some other embodiments, the clock synthesis circuitry includes a register to store the clock shaping data.

In another embodiment, a method, performed by display driver circuitry configured to refresh pixels of a display, of synthesizing a clock signal having a desired number of output clock pulses within a period between system heartbeat (SHB) pulses, includes: generating with a ring oscillator a reference clock signal having reference clock pulses; determining a ratio K representing a set of reference clock pulses occurring within a cycle of one of the output clock pulses, in which the set of reference clock pulses occurring within the cycle includes first and second portions of the set, the first and second portions being allocated for, respectively, first and second states of the cycle; and generating the output clock pulses based on the ratio K and the reference clock signal.

In some embodiments of the method, the reference clock pulses comprise first reference clock pulses at a first frequency, the method further comprising: generating with divide-by-M circuitry a second reference clock signal having second reference clock pulses at a second frequency that is the first frequency divided by a value M; counting the second reference clock pulses occurring within the period between SHB pulses to obtain a count; and determining the ratio K representing the set of first reference clock pulses occurring within the cycle of one of the output clock pulses by multiplying the value M times by the count to obtain a total number of first reference clock pulses occurring within the period between SHB pulses, and dividing the total number by the desired number of output clock pulses.

In other embodiments of the method, it also includes varying the first and second portions to reduce EMI.

In further embodiments of the method, the ring oscillator includes multiple groups of delay elements and the method further comprises selecting from a group of the multiple groups of delay elements a ring oscillator signal to serve as the reference clock signal.

In other embodiments of the method, it also includes performing a phase correction of the output clock pulses by extending a duration of one or both of the first and second states.

In some embodiments of the method, a binary number represents the set of reference clock pulses occurring within the cycle of one of the output clock pulses, and the method further comprising storing the binary number in a shift register clocked by the reference clock signal.

In still further embodiments of the method, first and second groups of bits of the binary number define, respectively, first and second logic levels to control the first and second states of the output clock pulses.

This technology described in this disclosure provides the following advantages: reduction of visual effects in an LED display caused by abrupt ending of refresh cycles; easier implementation of spread spectrum; the implementation is based on digital logic in some embodiment; analog components need not be used; less real estate and less silicon cost; and a resulting output clock is synchronized with, and readily realigned to, the SHB timing signal. Additional aspects and advantages will be apparent from the following detailed description of preferred embodiments, which proceeds with reference to the accompanying drawings.

BRIEF DESCRIPTION OF THE DRAWINGS

FIGS. 3-5 are block diagrams of clock shaping circuity and an edge-alignment calibration controller.

FIG. 6 is an annotated timing diagram showing how a parallel load signal is asserted for loading clock shaping data into a shift register of the clock shaping circuitry of FIG. 3.

FIGS. 7 and 8 are annotated timing diagrams showing two examples of the clock synthesis circuity configured with K equal to 10 and 15, respectively.

DETAILED DESCRIPTION OF EMBODIMENTS

Figure 1:
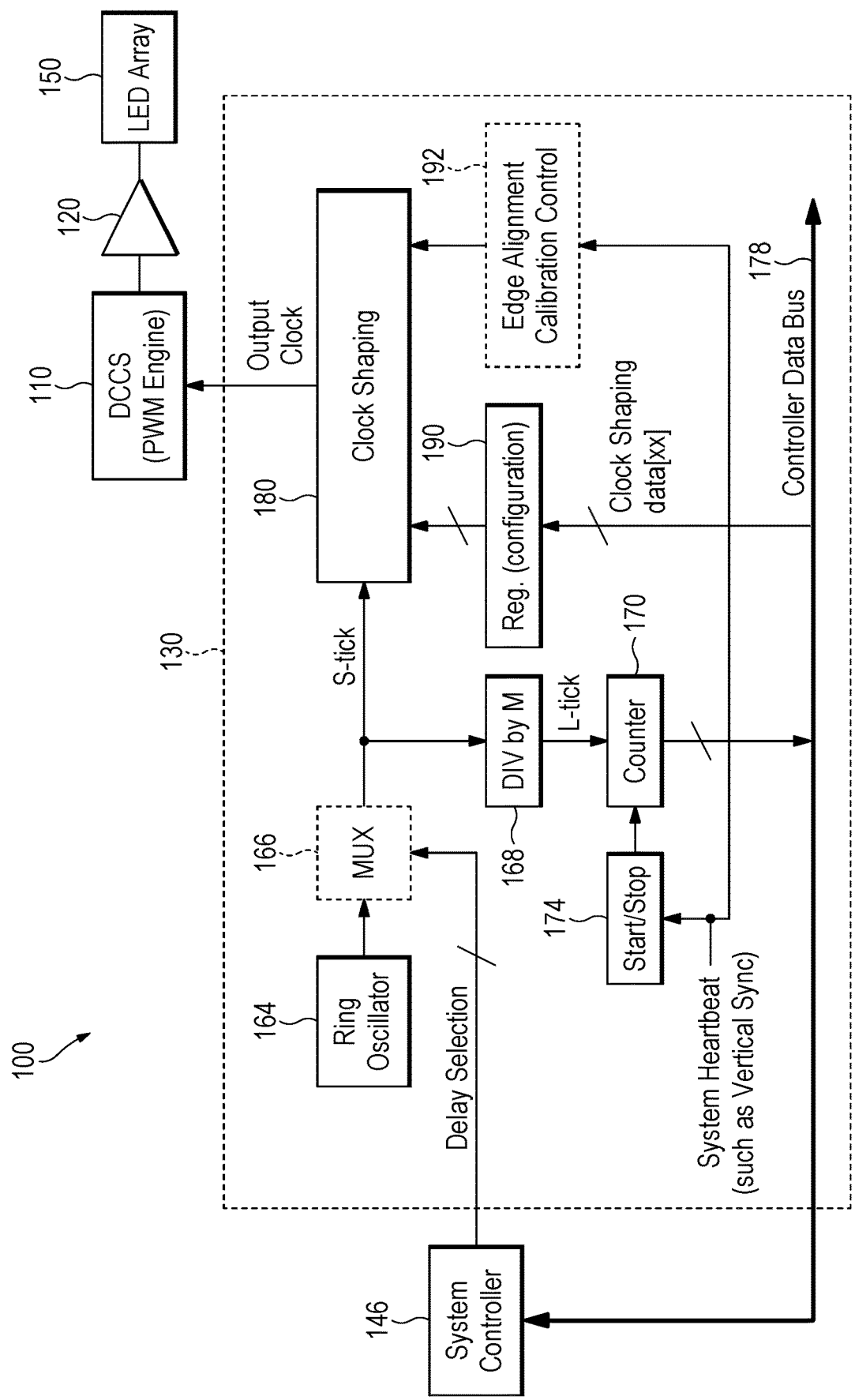
FIG. 1 s a block diagram of LED driver circuit including clock synthesis circuitry for producing a number of output clock pulses within a period between SHB pulses.

PLLs are prevalent features of integrated circuits (ICs) such as System On Chip (SOC) attempts. For example, PLLs are used in LED driver attempts of the type employed in large-scale digital signage applications. They are used due to difficulties in implementing a centralized clock across many logic components and PCB devices in the system. In such environments, PLLs produce accurate clocks facilitating a regularized synchronicity across all LED drivers based on a vertical synchronization (vertical sync) signal timing that defines a frame update and calls for delivery of new frame content to be displayed.

Although PLL designs are a versatile building block in IC design electronics today, and a common means to attempt to solve clock synchronization in electronic system designs, the PLL paradigm is complex and expensive in implementation. Some design alternatives are feasible in certain implementations of PLLs, but they mostly still rely on bulky analog implementation of the VCO and the loop filters. There are a few so-called all-digital PLL implementation options available, but they introduce system specification compromises.

It is desirable to have a display of high resolution. The smaller the size of a pixel pitch is, the higher the resolution of the display may be. And the higher the refresh clock rate, the higher the performance of the display is. Because of these factors, the refresh clock is often internally developed inside the LED control electronics, often deploying a PLL architecture.

In LED display driver IC designs based on PLL technology, an output clock is sometimes (depending on the choice of the controller used) not actually synchronized by a vertical sync signal because it is too slow for acting as a reference clock source to a high-frequency PLL. The slowness (e.g., 60 Hz) would cause the PLL's output signal timing to drift. Lack of true synchronization is an issue that manifests itself in several different aspects.

Some PLLs run slower than others due to inherent process-voltage-temperature (PVT) variations that characterize the behavior of the IC. To account for these variations, the PLLs of these chips are designed so that—irrespective of a range of variations—the PLL will ultimately produce a minimum desired number of clock pulses needed for ensuring the clock-driven processing tasks are completed in a timely manner. But at the high (fast) end of the range of variations, some PLL implementations will produce an excessive number of clock pulses, which effectively speeds up the clock-driven processing tasks. The excessive number of clock pulses causes the system to incur partial refreshes of LEDs. This happens when the last refresh cycle is completed too soon (e.g., due to the faster clock) and before the arrival of a new vertical sync signal (e.g., due to the unsynchronized PLL). In other words, since the system has completed a refresh, but has not received a new vertical sync signal, it then attempts to proceed with another refresh that is ultimately cut short when the vertical sync signal finally arrives. Thus, the partial refresh produces visual artifacts on the display.

A clock synthesis technique (i.e., an algorithm implemented in logic circuitry, as described in this disclosure) mitigates silicon PVT variations by initially determining a ratio factor (K) derived from the number of reference clock pulses per SHB pulse. The K-factor changes for each device due to PVT variations. For example, in some process variations, the reference clock might be slower, in which case the system determines that there are fewer reference clock (S-tick) pulses per SHB pulse. The value of K is configured accordingly. Conversely, when the reference clock (S-tick) is fast, the K-factor accounts for this difference so as to produce a same number of output clock pulses per SHB regardless of the process variation. Additionally, to extend or compress the output clock period, or otherwise to algorithmically vary clock timing to achieve spread spectrum for EMI reduction, the desired ratio K-factor may be dynamically controlled through spread spectrum profile logic circuitry.

To maintain precision and accuracy of the operation for updating the data to all pixels, the number of clock edges used in painting the pixels with the new content and consequent refreshing of the pixels by each LED driver in the system is the same for the clock synthesis approach. The predicable number of output clock pulses and their synchronization with SHB mitigates visual artifacts that may be caused in a PLL implementation by the partial refresh cycles.

An LED panel (LED display screen, LED display system, or simply, display) refers to a device that comprises an array of LEDs providing pixels or pixel modules, in which each pixel is defined by a group of different color LEDs (typically a red, a green, a blue LED). The device also comprises LED driver components for controlling the delivery and rendition of visual content on the screen. An array of LED drivers are electrically connected and communicatively coupled together through a plurality of interfacing signals including a clock signal from a clock. The clock controls the delivery of frame data to each LED driver and it also includes a system timing signal that identifies and synchronizes the start time of each frame data to all of the LED drivers. LED drivers are further equipped or supplied with a clock that is responsible for the rendition and refreshing of the content to the screen.

FIG. 1 shows a simplified block diagram of components in an LED driver circuit 100. LED driver circuit 100 may be an IC, or may be a plurality of electrically connected circuits, providing internal clock synthesis for GCLK generation for high performance and high definition LED panel systems. In the example of FIG. 1, LED driver circuit 100 includes PWM engine 110 employing a duty cycle control system (DCCS) architecture, a current source 120, and clock synthesis circuity 130. The components, in response to an SHB from, e.g., a system controller 146, control an LED array 150 of 48 channels (16-channels of each red, greed, and blue color LEDs) including 48×32 pixels (32 scan lines), according to one embodiment. The set of programmable scan lines are also actuated by a switching FET bank (not shown).

Clock synthesis circuity 130 provides an output clock (e.g., a GCLK) used by PWM engine 110 to generate a PWM signal that actuates current source 120 to drive LED array 150. Thus, current source 120 outputs a current to LED array 150 based on the received PWM signal from PWM engine 110. An example PWM engine is described in U.S. patent application Ser. No. 15/494,150 of Nadershahi, titled "Intensity Scaled Dithering Pulse Width Modulation," filed Apr. 21, 2017 by Planar Systems, Inc. More specifically, the DCCS architecture of PWM engine 110 has embedded SRAM memory having sufficient depth, configured as ping pong buffers, to ease the system clock and data transfers across from controllers. This provides sufficient memory depth to prevent over-runs and under-runs. There is on-chip SRAM (49,152 bits, which is 16 bits*32 scan*48 channel*2) for standard 16-bit DCCS storage and on-chip SRAM (12,288 bits, which is 8 bits*32 scan*48 channel) for low brightness compensation table memory storage. A high-speed, fully buffered daisy chained serial interface facilitates multiple driver cascading without external buffers. There are three programmable registers implemented for each color (red, green, and blue). Each of these are identified by the two most significant bits of the 16-bit registers.

Current gain control includes three eight-bit digital-to-analog converters (DACs, not shown), each controlling the constant current for colors red, green, and blue. DAC current gain is an eight-bit value in the configuration register bits (bit numbers 7 through 0, or 7:0) providing an eight-bit linear programmable output current gain of each color. The current gain of the DCCS architecture can be programmed to 256 gain steps through the three programmable DACs for brightness adjustment.

Clock synthesis circuitry 130 provides GCLK frequency of up to 128 MHz, according to one embodiment. The clock synthesis approach is smaller to implement on-chip and superior to that of a conventional PLL design because it precisely generates a selectable number of clock edges within each frame for updating frame content. Clock synthesis circuitry 130 includes a ring oscillator 164 that is optionally used in conjunction with a multiplexer 166 to select different groupings of delay elements resulting in frequency variations at the output of ring oscillator 164. Additional details of the selection of different groupings of delay elements are described later with reference to FIG. 11.

Ring oscillator 164 generates a first reference clock signal, called a small tick, or S-tick, having a first tick frequency. According to some embodiments, an S-tick is on the order of 8 nanoseconds (ns) and may range from 1 ns to 30 ns or higher, depending on the design. The term S-tick may, depending on the proper context, be used to generally refer to the first reference clock signal, or to specifically refer to a tick within that signal. The term tick should be understood to refer to a clock edge (rising or falling), high (or low) pulse state, or an S-tick cycle because, as appreciated by skilled persons, since some digital systems employ timing driven by leading edges whereas other systems may use falling edges. Relatedly, the term pulse may refer to a discrete state of a timing signal and it is also used as a shorthand implying a clock edge (again, since some digital systems use timing driven by leading edges whereas other systems may use falling edges).

The S-tick is then applied to divide-by-M circuitry 168 that, in response to application of the first reference clock signal, generates a second reference clock signal referred to as a large tick, or L-tick, having a second tick frequency that is the first tick frequency divided by an integer value referred to as "M." An example of divide-by-M circuitry is described later with reference to FIG. 12.

One reason for creating the L-tick is that its pulses can be readily counted and tracked with fewer bits of information than would be needed to count pulses of the S-tick, which operates at a higher frequency. Accordingly, counter circuitry 170 counts a number of pulses of the L-tick occurring within a period between SHB pulses and thereby provides a corresponding counter value. In other words, counter circuitry 170 is used to count up starting at the presence of the one SHB pulse and ending at the presence of the consecutive SHB pulse, as controlled by start/stop circuitry 174 that coordinates the counting process.

The counter value is then read by system controller 146. In other words, a controller data bus 178 provides a data interface between counter circuitry 170 and system controller 146. Example interfaces include I²C, serial peripheral interface (SPI), universal asynchronous receiver/transmitter (UART), 1-wire, or a proprietary interface. According to one embodiment, the counter value is transfers to system controller 146 for processing as described in the next three paragraphs. Skilled persons will appreciate, however, that such processing may be carried out by additional logic components included in clock synthesis circuitry 130.

First, system controller 146 reads the counter value to determine a ratio K. Determination of the ratio K is made based a mathematical calculation described later with reference to FIG. 2. Initially, however, note that the ratio K represents a number of pulses (e.g., counted as rising or falling edges) of the S-tick per a cycle of an output clock pulse. For example, the ratio K might be equal to 10, which means there are 10 so-called S-ticks in one period of the output clock pulses.

Second, based on the ratio K, system controller 146 generates clock shaping data [xx] (described later with reference to FIGS. 3, 7, and 8). Note that that clock shaping data[xx] includes, according to some embodiments, a binary number in which a first portion of its bits represent a first logic level and a second portion of its bits represent a second logic level that is different from the first logic level. The first and second portions are applied to clock shaping circuitry 180 to establish, respectively, first and second states of pulses of output clock pulses. For example, the clock shaping data[xx] might include a K/2 number of binary "1" values for its least significant bits, a K/2 number of binary "0" values for its most significant bits, and a separate binary number that represents the actual value of K (e.g., 10) so as to indicate a feedback loop length for cycling the binary "1" and "0" of the clock shaping data[xx] through a shift register described later with reference to FIG. 3.

Third, and finally, system controller 146, through controller data bus 178, loads clock shaping data[xx] into a storage register 190. The clock shaping data[xx] saved in register 190 is then used by clock shaping circuitry 180 to generate the output clock signal for PWM engine 110.

System controller 146 may be packaged together in a common IC with LED driver circuit 100, or it may be located on a separate PCB that carries a microcontroller, digital signal processor (DSP), or other logic controller such as a central processing unit (CPU), a reduced instruction set computing (RISC) processor, a complex instruction set computing (CISC) processor, a graphics processing unit (GPU), an application specific integrated circuit (ASIC), another type of controller, or any suitable combination thereof capable of acting as system controller 146 for controlling LED driver circuit 100.

LED driver circuit 100 may include other features (not shown) for the display device. For example, the DCCS architecture includes a serial interface as a mechanism by which the data, configuration information, and commands are communicated to and from the DCCS architecture device. The interface accommodates the following signals: serial data input; clock input to shift in the serial data, called display clock (DCLK), and has a frequency up to 12 MHz; serial data output from the chip as destined for other chips serially connected to this device; and latch enable that controls the mode of operation on the serial interface between a first mode in which serial data is transferred to the DCCS SRAM buffer (ping or pong), and a second mode in which the display frame content will be updated to an output channel in response to a vertical sync signal. A low brightness compensation technique ensures one GCLK cycle generates sufficient brightness for viewing. The DCCS architecture and its embedded features facilitate increased visual refresh rate, to reduce flicker, and improve the overall video quality.

Finally, FIG. 1 shows an optional edge-alignment calibration controller 192. This component is described later with reference to FIGS. 3 and 13.

Figure 2:
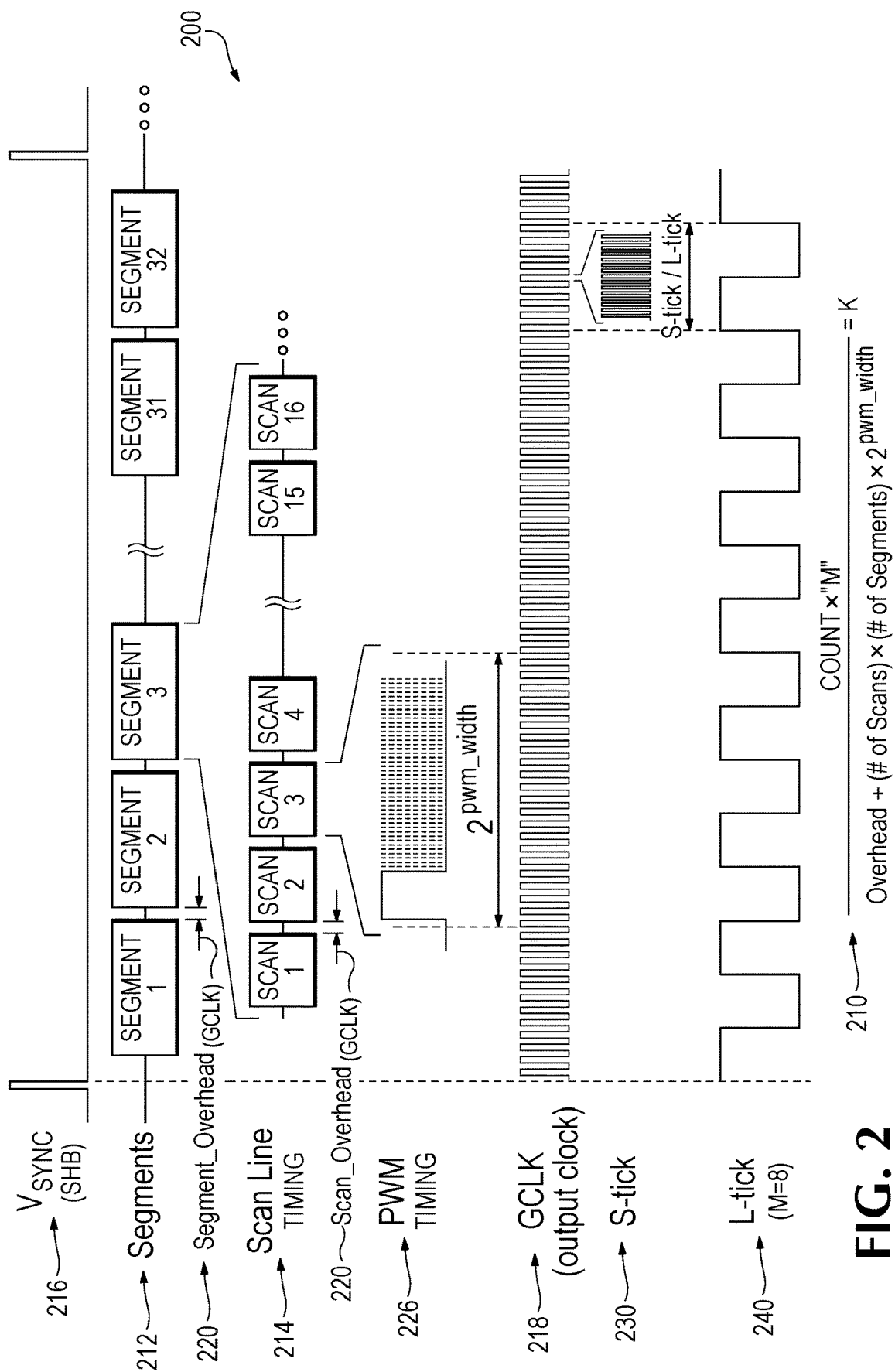
FIG. 2 is an annotated timing diagram showing an example and associated formula for determining a ratio K representing a set of reference clock pulses occurring within a cycle of one of an output clock pulses, e.g., one cycle of a grayscale clock (GCLK).

FIG. 2 shows a timing diagram 200 and an associated equation 210 for calculating the ratio K. Timing diagram 200 shows 32 refresh cycles (called segments) 212 for displaying frame content. In this simplified example, each segment 212 has 16 scan lines 214, corresponding to 16 pixels, such that LED driver circuit 100 would load 16 grayscale values, one for each scan line 214. To further simplify the discussion below, a single grayscale value and scan line are described, but skilled persons will recognize that the discussion also applies to each of the grayscale values and scan lines. Moreover, although FIG. 2 shows 32 segments 212 and 16 scan lines 214, various numbers of segments and scans lines may be used depending on the desired specifications for the PWM display system. For example, a timing diagram may be specified for 16 segments and 16 scan lines, or a timing diagram may be specified for 64 segments and 16 scan lines.

A vertical synchronization (Vsync, or more generally, an SHB) signal 216 indicates a new frame content should be displayed. After a pulse of a Vsync signal 216 is received, a high pulse of a latch enable (LE) signal (not shown) provides a read command to begin displaying the frame content related to newly received grayscale value input. For a 120 Hz frame rate, each frame of content is displayed and refreshed for 8.33 ms. For a 60 Hz frame rate, each frame of content is displayed and refreshed for 16.67 ms. Between each Vsync signal 216, a GCLK (or more generally, output clock) signal 218 has about $2^{20}$ clock cycles in this example, for a 16-bit architecture. The frame rate also determines the frequency of GCLK signal 218.

As mentioned, each segment 212 includes multiple scan lines 214 that represent the number of pixels scanned with each LED driver output. For example, in FIG. 2, 16 pixels are scanned during each segment 212. Thus, 16 grayscale values are loaded into LED driver circuit 100, and each of the 16 pixels are driven based on its respective grayscale value. Each scan line 214 in FIG. 2 represents one pixel, which, as mentioned above, may include a single LED or multiple LEDs. Also, as shown in FIG. 2, there is a certain amount of overhead 220 defined as a total number of cycles of GCLK signal 218 occurring in a cycle of SHB 216 between each segment 212 and between each scan line 214 of a segment 212.

During each scan line 214, a current is applied to the LED(s) for a corresponding pixel. The current is applied for a duration that is based on a PWM signal 226, which is defined by a grayscale value. For example, each scan line 214 is divided into a number of clock cycles representing the resolution of the display system. For a system with a standard HDMI input of 12 bits, the corresponding scan period is divided into $2^{pwm\_width}$ clock cycles, where pwm_width is 12 in this example. Thus, in this example, a PWM pulse width may be anywhere between 0 and 4,096 (i.e., $2^{12}$) cycles of GCLK signal 218. The longer the width of the pulse, the higher the time-averaged amount of current applied to the LED over segment 212.

As shown in a denominator of equation 210, the number of output clock pulses within a period between SHB pulses is determined by adding overhead 220 to the product of the number of segments 212 within the period between SHB pulses, times the number of scans 214 per segment, times $2^{pwm\_width}$. The numerator represents a total number of S-ticks 230 in the period between SHB pulses 216, which is calculated by taking the count value of L-ticks 240 within the period between SHB pulses (i.e., 8 shown in FIG. 2, for simplify) times the number M (which would be fairly high to produce just eight L-ticks). Dividing the numerator by the denominator produces the ratio K representing a number of S-ticks per one cycle of GCLK signal 218.

Figure 3:
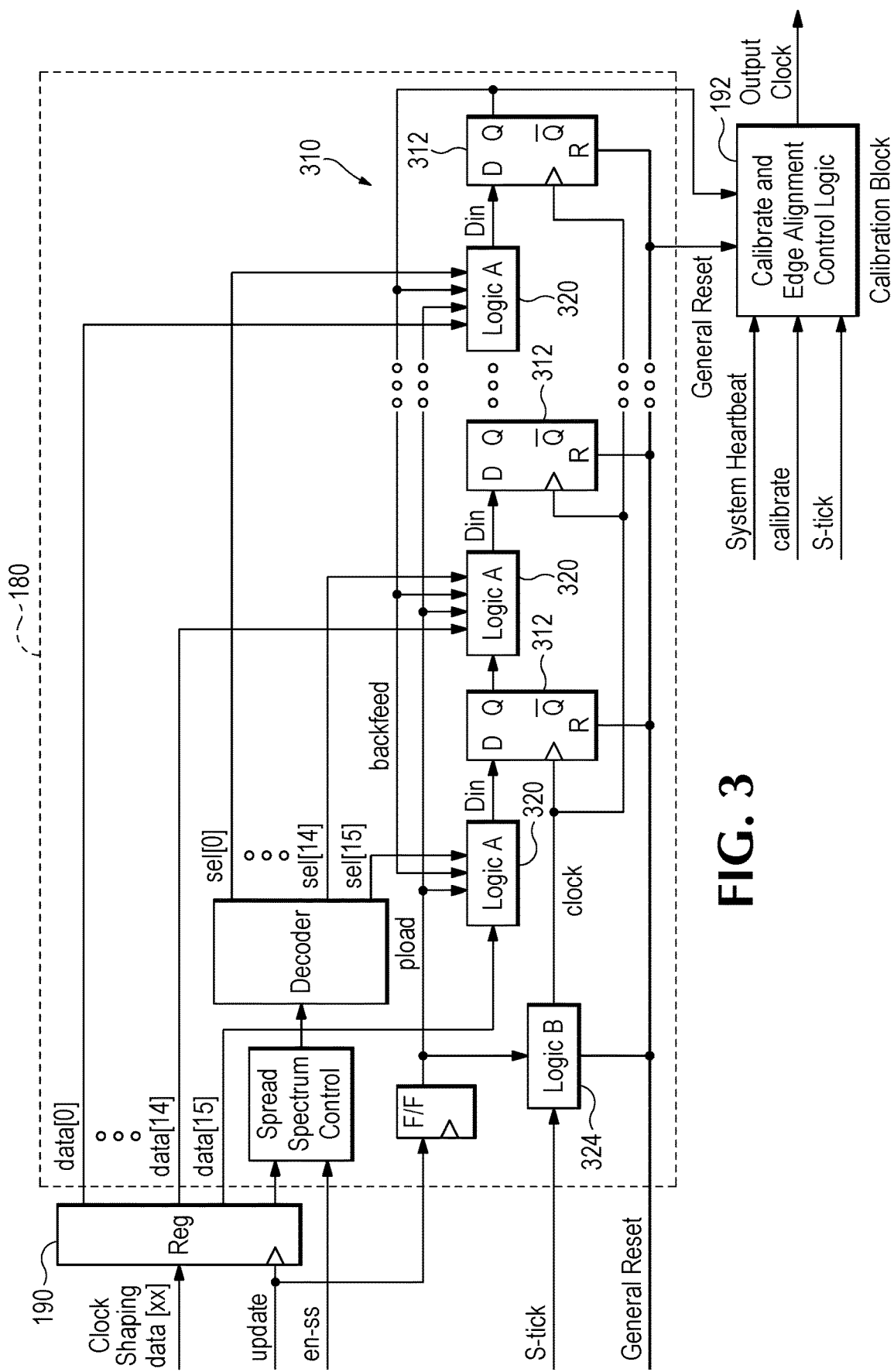

The block diagrams of FIGS. 3-5 show an example of clock shaping circuitry 180. As shown, data[15:0] obtained from clock shaping data[xx] stored in register 190 is loaded into a shift register 310 that is clocked by S-tick and implemented by D flip-flops 312 and associated logic A 320 and logic B 324 shown in FIGS. 4 and 5.

An operative length of shift register 310 (e.g., up to 16 bits in this example for K equals 16, but longer or shorter lengths are possible) is configured using sel[15:0] values obtained from clock shaping data[xx]. Boolean bit values of sel[15:0] identify which corresponding bit values from data[15:0] are enabled to be shifted toward the output of shift register 310 on every S-tick. Circular shifting is then provided by back-feed so that the output is eventually wrapped around to generate an output clock signal that maintains its states based on the number of consecutive ones and zeros programmed into register 190. Examples of the programming for different values of K are described later with reference to FIGS. 7 and 8. Optional SSC is also described later with reference to FIGS. 9 and 10. And optional calibration is described later with reference to FIG. 13.

Skilled persons will appreciate that programming how many S-ticks produce a high state of the output clock, and how many result in a low state, could be implemented in variety of ways that need not include shift registers, flip flops, and the like. For example, another design might use counters and logic gates outside of the counters.

Clock shaping circuitry 180 also includes logic, including flip-flop 340, and associated logic gates of logic A 320 and logic B 324, designed to clear shift register 310 and allow for D flip-flops 320 to load in parallel (in response to a pload signal) new clock shaping data. For example, FIG. 6 shows that when pload 610 is set, a single clock pulse 620 is issued to cause parallel loading of data into shift register 310. When pload 610 is removed, clocks 622 are applied begin operation of shift register 310.

Figure 8:
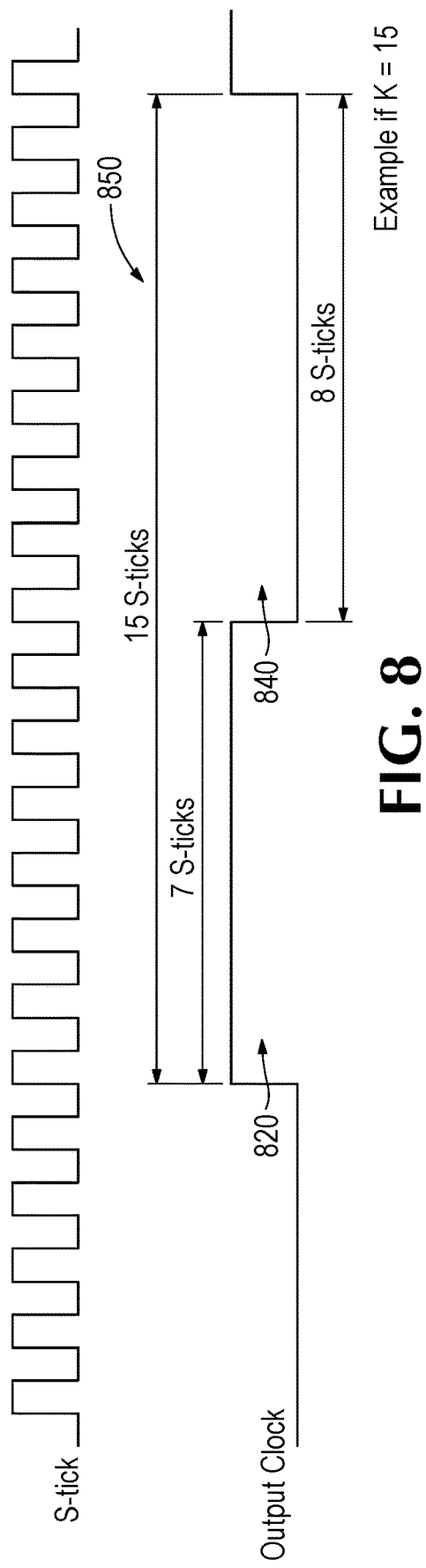

Timing diagrams of FIGS. 7 and 8 show how clock synthesis circuitry 130 operates according to two different values of K.

FIG. 7 shows a first example timing diagram 700 in which K equals 10. The value results in symmetric, high- and low-pulse widths (five S-ticks high, five S-ticks low) per each cycle of an output clock signal 710. As described previously, data[15:0] is programmed to the following binary value (denoted with prefix "0b"): 0b 0000 0000 0001 1111. The first five bits having "1" values indicate that a first state 720 of a cycle 730 of output clock signal 710 should have a high logic level. The next five bits having "0" values indicate that a second state 740 of output clock signal 710 should have a low logic level. Accordingly, the first ten bits of sel[15:0] have "1" values to indicate that there are 10 operative bits of data[15:0]. Similarly, the last six bits of sel[15:0] have "0" values to indicate that the last six bits of data[15:0] are not employed by shift register 310. The ten operative bits of data[15:0] are cycled or looped though shift register 310 (and associated logic of FIGS. 4 and 5) so as to produce high and low states 720 and 740 during each cycle of output clock signal 710.

In the example of FIG. 7, high state 720 generally corresponds to a K/2 number of S-ticks. But sometimes, e.g., when K is an odd number, calculating K/2 produces a remainder. FIG. 8 shows one such example in which K equals 15 (and K/2 equals 7.5). The 0.5 remainder, however, need not be included in a number (i.e., seven) of S-ticks corresponding to a high state 820 and is instead included in a number (i.e., eight) of S-ticks corresponding to a low state 840. Specifically, FIG. 8 shows asymmetric, high- and low-pulse widths (seven S-ticks high, eight S-ticks low) per each cycle 850 of an output clock signal. As in the previous example, the high and low numbers of S-ticks correspond the value of bits of data[15:0] and sel[15:0]. In other words, data[15:0] is set to the binary value 0b 0000 0000 0111 1111; sel[15:0] is set to 0b 0111 1111 1111 1111. Thus, when the value of K is an odd number, the clock shaping data includes (K/2−1) bits for high states and (K/2+1) bits for low states. Other allocations and asymmetric duty cycles are also possible.

Figure 9:
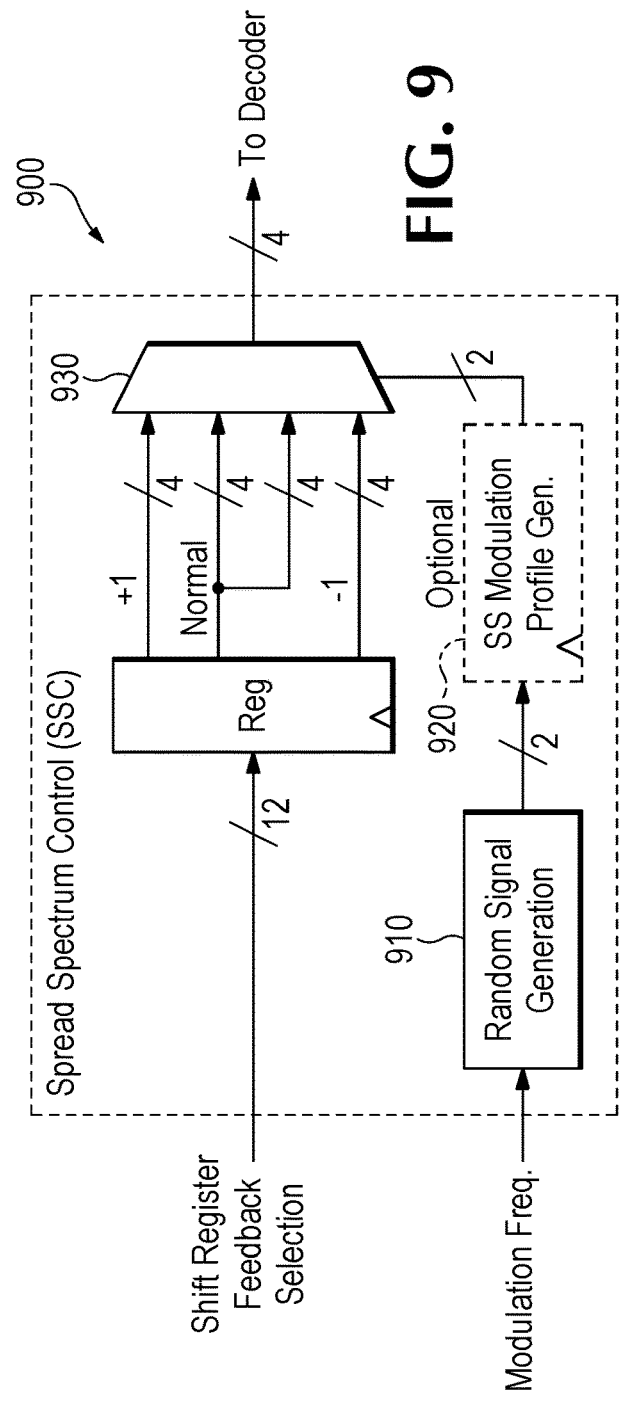
FIG. 9 is a block diagram of spread spectrum control (SSC) circuitry suitable for use in the clock shaping circuitry shown in FIG. 1 or 3.

FIG. 9 shows an optional circuit 900 for SSC utilizing randomization techniques for temporally modifying temporal positions of clock edges of an output clock signal, thereby spreading its frequency component and reducing EMI. In other words, by introducing slight randomization of the clock frequency, the energy of the clock signal is spread out. This reduces the maximum peak energy under the same total amount of energy. A relatively small amount of variation in frequency is typically sufficient to obtain several decibels of energy reduction, which has an EMI reduction equivalent to that obtained by relatively expensive shielding that would otherwise be used to achieve a similar result.

Skilled persons will appreciate that there are a variety of techniques available to introduce cycle-by-cycle or long-term jitter with respect to the temporal position of clock edges. FIG. 9 shows one such example in which a modulation signal (e.g., a 30 kHz modulation frequency) is applied to a random signal generator 910. The output of random signal generator 910 is then optionally applied to a spread spectrum modulation profile generator 920, which is used to randomly select as an output from a multiplexer 930 a four-bit randomization value. The four-bit randomization value is then decoded to generate selection bits (sel[15:0]) described previously. The randomization of the selection bits introduces jitter into the signals controlling shift register 310.

Note that profile generator 920 may also be used without random signal generator 910. In that embodiment, profile generator 920 generates a particular frequency, such as 30 kHz, for controlling mux 930.

Figure 10:
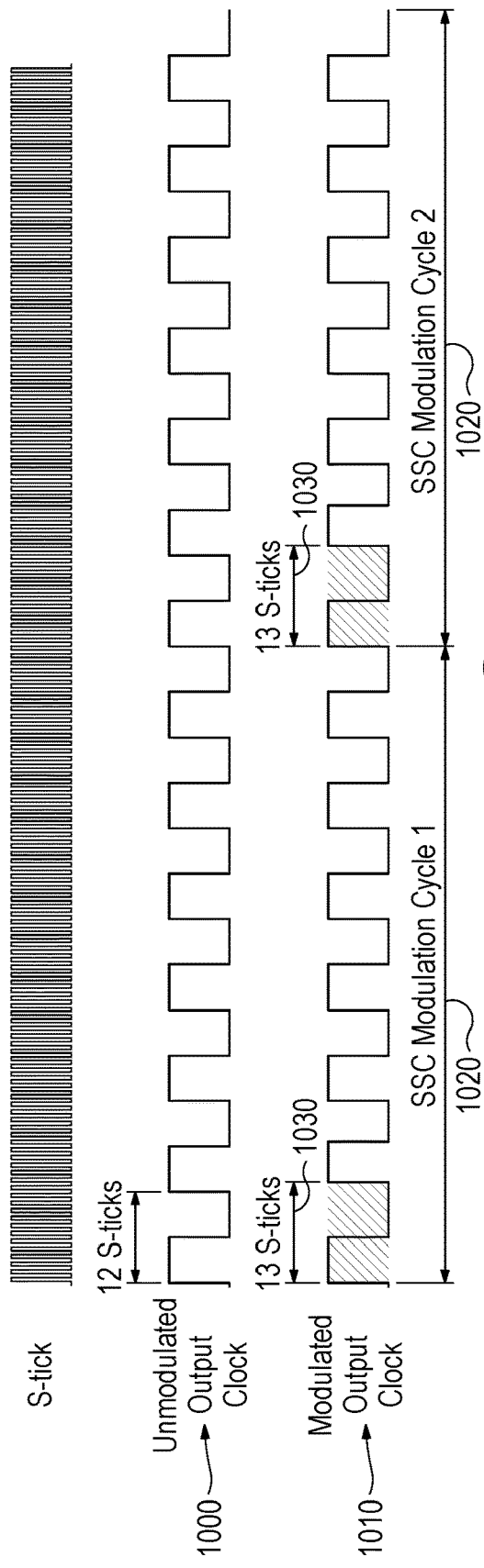
FIG. 10 is an annotated timing diagram showing the operation of the SSC circuitry of FIG. 9.

FIG. 10, for example, shows a timing diagram in which the introduced jitter creates a variations in temporal position of clock edges of a hypothetical (non-spread) output clock 1000 to produce a modulated output clock 1010 having a resulting frequency that is spread according to a spread spectrum modulation cycle 1020 defined by the aforementioned modulation frequency. Note that a random additional tick causing 13 ticks 1030 (or a comparable one-tick reduction) need not occur each spread spectrum modulation cycle 1020, but may instead occur during random cycles. In other embodiments, a nominal length of a modulation cycle itself could also be randomized.

Figure 11:
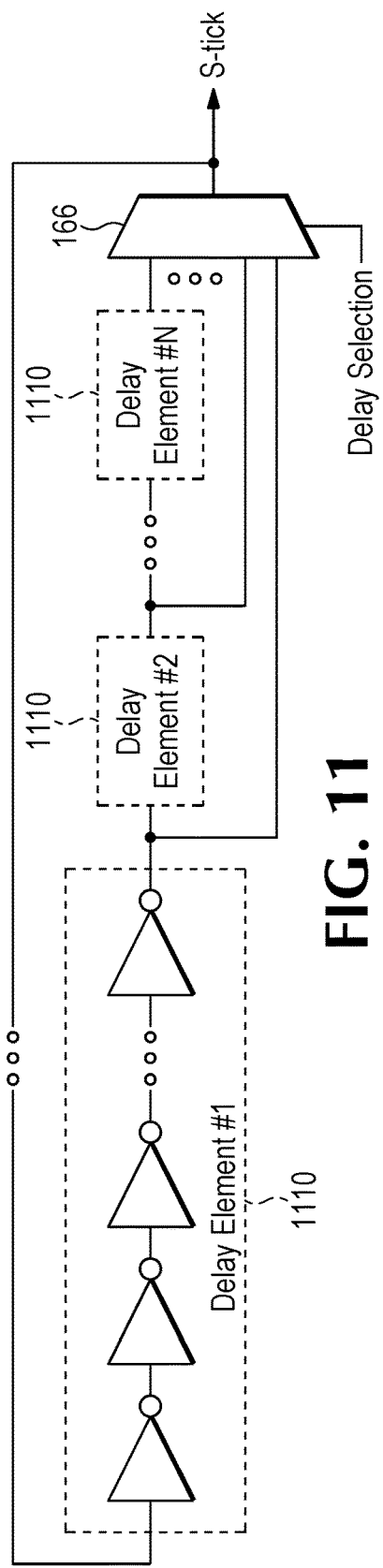
FIG. 11 is a block diagram showing a ring oscillator having selectable groups of delay elements for selecting a duration of a period a reference clock.

FIG. 11 shows an example of details of a ring oscillator 1100 suitable for use as ring oscillator 164 (FIG. 1). Ring oscillator 1100 includes multiple delay elements 1110. Each delay element 1110 includes a number of simple logic elements (such as an inverter) arranged in series to produce a propagation delay that is roughly equivalent to what the IC minimum delay processing is designed to be. The number of the simple gate elements in each delay element 1100 is decided based on the choice of the process and the technology in fabrication of the IC. For example, the number of gate elements might be selected such that each delay element 1110 has about 1 ns in its propagation delay. Thus, to produce an S-tick having a period of about 8 ns, an output from a first eight delay elements 1110 is selected from multiplexer 166. The output of multiplexer 166 is then fed back to the input of ring oscillator 1100, which effectively bypasses any additional delay elements 1110 (after the eight selected ones). On the other hand, additional delay elements may be selected to effectively lengthen the period of the S-tick.

Differences in the selected group(s) of delay elements address speed variations that may be caused by PVT fabrication differences that each IC experiences. In other words, eight delay elements of one IC may actually produce an S-tick that is closer to 9 ns, in which case seven delay elements are selected during a calibration procedure so as to adjust the period of the S-tick so that it is closer to 8 ns that is specified for the IC or the application. The delay selection may be made by system controller 146 (FIG. 1) or other device that calibrates the S-tick.

Figure 12:
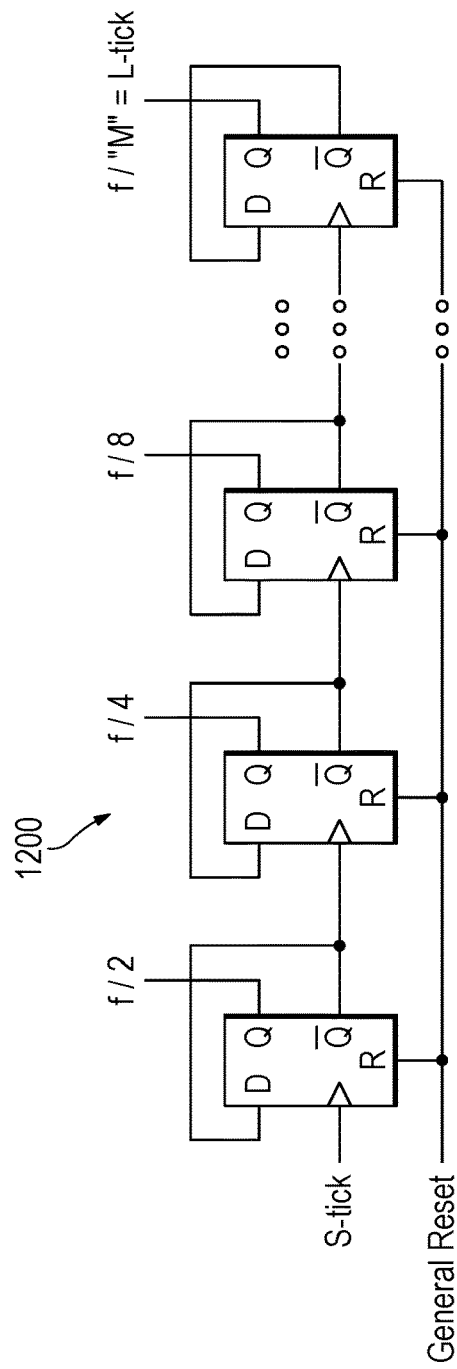
FIG. 12 is a block diagram of divide-by-M circuitry.

FIG. 12 shows an example of divide-by-M logic 1200 that is suitable for use in clock synthesis circuitry 130 (FIG. 1). Because the clock frequency from the ring oscillator is relatively high and less optimal for use in counting, the S-tick is divided into an integer number (typically 16, 64, or other values) to produce the slower L-tick that is more suitable for not overflowing counting logic. The divisions, in the example of FIG. 12, are established by a series of flip flops. Skilled persons will appreciate that other clock dividing circuitry may be used.

Figure 13:
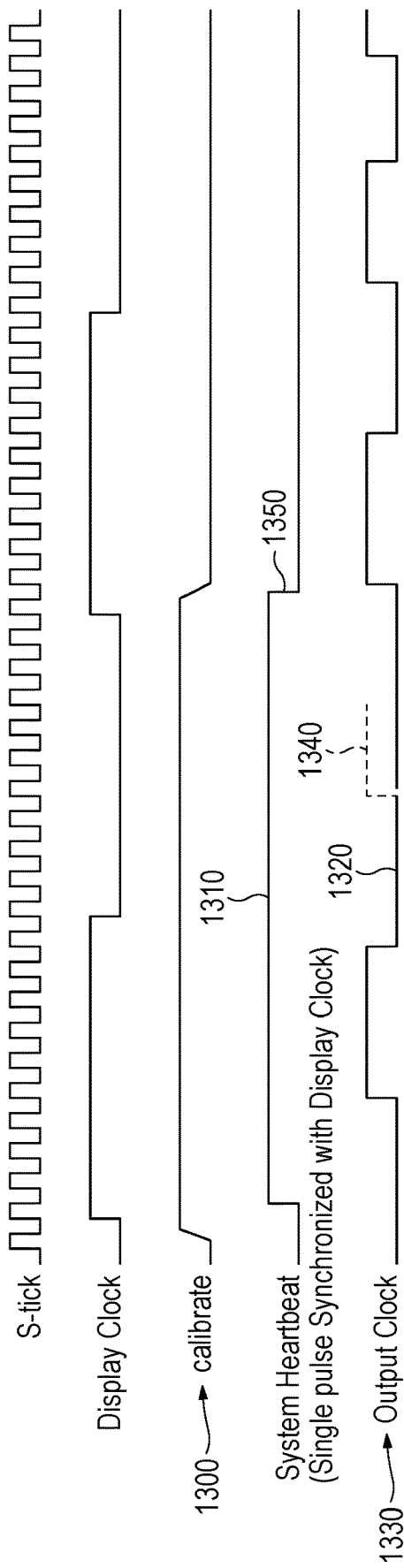
FIG. 13 is an annotated timing diagram showing an example of an edge-alignment calibration process.

FIG. 13 shows the operation of calibration control logic block 192 (FIGS. 1 and 3), which provides edge alignment of an output clock with an edge starting an SHB cycle. For example, if a first GCLK pulse has drifted out of alignment with the timing of the SHB, then the GCLK timing can be resynchronized by, e.g., extending or compressing the duration of one GCLK pulse such that an edge of the subsequent pulse is realigned with that of the SHB. This process can be invoked at any time, not just at a leading edge of the SHB. Realignment at the beginning of the refresh cycles (e.g., in response to a new vertical sync), however, by stretching of the low period of the last GCLK from the previous cycle tends to mitigate any impact on functionality vis-à-vis adjusting during an intermediate portion of a refresh cycle.

Specifically, FIG. 13 shows the operation of the calibration procedure. When a signal named "calibrate" 1300 is asserted, calibration control logic block 192 uses the synchronized version of an SHB (e.g., vertical sync synchronized with DCLK) pulse 1310 to perform the edge alignment between the vertical sync and the GCLK. For example, when calibrate 1300 is asserted, then during SHB 1310 a low side of output pulse low state 1320 of output clock signal 1330 is temporally extended so that a rising edge 1340 is temporally repositioned to align with a falling edge 1350 of SHB 1310. The operation is advantageously performed at the beginning of vertical sync timing while rest of the logic dependent upon the output clock for precision timing is not yet executing, but this operation can be performed at any time to force alignment of the GCLK with the SHB.

Skilled persons will understand that many changes may be made to the details of the above-described embodiments without departing from the underlying principles of the invention. For example, clock synthesis circuitry 130 (FIG. 1) may comprise any device or circuit now known or that may be developed in the future to synthesize an output clock signal from a ring oscillator. For example, clock synthesis circuitry 130 may comprise devices such as comparators, amplifiers, oscillators, counters, frequency generators, ramp circuits and generators, digital logic, analog circuits, application specific integrated circuits (ASIC), microprocessors, microcontrollers, digital signal processors (DSPs), state machines, digital logic, field programmable gate arrays (FPGAs), complex logic devices (CLDs), timer integrated circuits, digital to analog converters (DACs), analog to digital converters (ADCs), and other circuitry. The terms circuit and circuitry refer to, may be part of, or include an ASIC, an electronic circuit, a processor (shared, dedicated, or group), or memory (shared, dedicated, or group) that executes one or more software or firmware programs, a combinational logic circuit, or other suitable hardware components that provide the described functionality. In some embodiments, the circuitry may be implemented in, or functions associated with the circuitry may be implemented by, one or more software or firmware modules. In some embodiments, circuitry may include logic, at least partially realized in hardware. The scope of the present disclosure should, therefore, be determined only by claims of a non-provisional patent application.

The invention claimed is:

1. Clock synthesis circuitry for producing a number of output clock pulses within a period between system heartbeat (SHB) pulses, the clock synthesis circuitry comprising:
   a ring oscillator to generate a first reference clock signal having a first tick frequency, wherein the ring oscillator includes multiple groups of delay elements;
   a multiplexer to select from a group of the multiple groups of delay elements a ring oscillator signal to serve as the first reference clock signal;
   divide-by-M circuitry that, in response to application of the first reference clock signal, generates a second reference clock signal having a second tick frequency that is the first tick frequency divided by a value M;
   counter circuitry to count a number of pulses of the second reference clock signal that occur within the period between SHB pulses and thereby provide a corresponding counter value;
   a data interface to receive clock shaping data that is generated based the corresponding counter value and the number of output clock pulses such that the clock shaping data represents a number of pulses of the first reference clock signal per a cycle of the output clock pulses; and
   clock shaping circuitry to generate the output clock pulses based on the clock shaping data and the first reference clock signal.

2. The clock synthesis circuitry of claim 1, in which the clock shaping circuitry comprises a spread spectrum controller to vary a pulse width of one or more pulses of the output clock pulses.

3. The clock synthesis circuitry of claim 1, further comprising an edge alignment calibration controller communicatively coupled to the clock shaping circuitry and configured to temporally align a pulse of the output clock pulses with a pulse of the SHB pulses.

4. The clock synthesis circuitry of claim 1, in which the SHB pulses are vertical frame update pulses of display driver circuitry.

5. The clock synthesis circuitry of claim 1, in which the output clock pulses are grayscale clock (GCLK) pulses of display driver circuitry.

6. The clock synthesis circuitry of claim 1, further comprising a shift register of the clock shaping circuitry, the shift register having a feedback path length equal to the number of pulses of the first reference clock signal per a cycle of the output clock pulses.

7. The clock synthesis circuitry of claim 6, in which a first portion of the bits have a first logic level and a second portion of the bits have a second logic level that is different from the first logic level, the first and second portions establishing, respectively, first and second states of pulses of the output clock pulses.

8. The clock synthesis circuitry of claim 1, in which the divide-by-M circuitry includes a chain of D flip-flop logic elements.

9. The clock synthesis circuitry of claim 1, in which the data interface is communicatively coupled to a system controller that, in response to receiving the corresponding counter value, determines, based the corresponding counter value and the number of output clock pulses, a ratio K representing the number of pulses of the first reference clock signal per the cycle of the output clock pulses, and provides the clock shaping data representing the ratio K.

10. The clock synthesis circuitry of claim 1, further comprising a register to store the clock shaping data.

11. A method, performed by display driver circuitry configured to refresh pixels of a display, of synthesizing a clock signal having a desired number of output clock pulses within a period between system heartbeat (SHB) pulses, the method comprising:
   generating with a ring oscillator a reference clock signal having reference clock pulses;
   determining a ratio K representing a set of reference clock pulses occurring within a cycle of one of the output clock pulses, in which the set of reference clock pulses occurring within the cycle includes first and second portions of the set, the first and second portions being allocated for, respectively, first and second states of the cycle; and
   generating the output clock pulses based on the ratio K and the reference clock signal.

12. Method of claim 11, in which the reference clock pulses comprise first reference clock pulses at a first frequency, the method further comprising:
   generating with divide-by-M circuitry a second reference clock signal having second reference clock pulses at a second frequency that is the first frequency divided by a value M;
   counting the second reference clock pulses occurring within the period between SHB pulses to obtain a count; and
   determining the ratio K representing the set of first reference clock pulses occurring within the cycle of one of the output clock pulses by multiplying the value M times by the count to obtain a total number of first reference clock pulses occurring within the period between SHB pulses, and dividing the total number by the desired number of output clock pulses.

13. The method of claim 11, further comprising varying the first and second portions to reduce electromagnetic interference (EMI).

14. The method of claim 11, in which the ring oscillator includes multiple groups of delay elements and the method further comprises selecting from a group of the multiple groups of delay elements a ring oscillator signal to serve as the reference clock signal.

15. The method of claim 11, further comprising performing a phase correction of the output clock pulses by extending a duration of one or both of the first and second states.

16. The method of claim 11, in which a binary number represents the set of reference clock pulses occurring within the cycle of one of the output clock pulses, and the method further comprising storing the binary number in a shift register clocked by the reference clock signal.

17. The method of claim 16, in which first and second groups of bits of the binary number define, respectively, first and second logic levels to control the first and second states of the output clock pulses.

\* \* \* \* \*